United States Patent
Polykarpov et al.

(10) Patent No.: US 6,174,642 B1
(45) Date of Patent: Jan. 16, 2001

(54) IMAGING SYSTEM EMPLOYING ENCAPSULATED RADIATION SENSITIVE COMPOSITION

(75) Inventors: Alexander Y. Polykarpov, Mason; Joseph C. Camillus, Centerville, both of OH (US)

(73) Assignee: Cycolor, Inc., Miamisburg, OH (US)

( * ) Notice: Under 35 U.S.C. 154(b), the term of this patent shall be extended for 0 days.

(21) Appl. No.: 09/257,624

(22) Filed: Feb. 25, 1999

Related U.S. Application Data

(60) Provisional application No. 60/075,892, filed on Feb. 25, 1998.

(51) Int. Cl.$^7$ .................................................. G03C 1/72
(52) U.S. Cl. ............................................ 430/138; 430/944
(58) Field of Search ..................................... 430/138, 944

(56) References Cited

U.S. PATENT DOCUMENTS

| | | | |
|---|---|---|---|
| 4,772,530 | 9/1988 | Gottschalk et al. | 430/138 |
| 4,842,976 | 6/1989 | Sanders et al. | 430/138 |
| 5,783,353 | 7/1998 | Camillus et al. | 430/138 |
| 6,022,664 * | 2/2000 | Washizu et al. | 430/138 |

FOREIGN PATENT DOCUMENTS

| | | |
|---|---|---|
| 0223587 | 11/1986 | (EP) . |
| 0408227 | 7/1990 | (EP) . |
| 0438123 | 1/1991 | (EP) . |
| 002106181 | 9/1992 | (GB) . |
| 3-221506 * | 9/1991 | (JP) . |
| 3221506 | 9/1991 | (JP) . |
| 4261405 | 9/1992 | (JP) . |
| 834808 | 2/1996 | (JP) . |
| 8100011 | 4/1996 | (JP) . |
| 8100012 | 4/1996 | (JP) . |

OTHER PUBLICATIONS

English Translation of JP 3221506, Sep. 1991.*
Derwent Abstract of JP 3–221506, Sep. 1991.*

* cited by examiner

*Primary Examiner*—Janet Baxter
*Assistant Examiner*—Rosemary Ashton
(74) *Attorney, Agent, or Firm*—Thompson Hine & Flory LLP

(57) ABSTRACT

An imaging system comprising a support having a layer of at least one set of photosensitive microcapsules on the surface thereof, wherein the microcapsules are sensitive to a distinct band of radiation and contain a complex of an infrared sensitive cationic dye and a boranyl anion. In a preferred embodiment, the photosensitive microcapsules include a first set of microcapsules containing a cyan color-forming agent, a second set of microcapsules containing a magenta color-forming agent, and a third set of microcapsules containing a yellow color-forming agent, wherein at least one of said first, second and third sets of microcapsules include an infrared sensitive dye borate compound as a photoinitiator. Optionally at least one other set may include a visible light sensitive dye borate compound or an ultraviolet initiator.

8 Claims, No Drawings

IMAGING SYSTEM EMPLOYING ENCAPSULATED RADIATION SENSITIVE COMPOSITION

CROSS-REFERENCE TO RELATED APPLICATIONS

The present invention claims priority under 35 U.S.C. §119 from Provisional Patent Application Serial No. 60/075,892, filed Feb. 25, 1998.

BACKGROUND OF THE INVENTION

This application is directed to an improvement in the imaging system which is described in U.S. Pat. Nos. 4,399,209, 4,440,846 and 4,772,530 to Cycolor, Inc. These imaging systems employ a layer of photosensitive microcapsules. The microcapsules are prepared by microencapsulating a free radical polymerizable composition which contains an electron donating color precursor. Typically the image system assumes two forms. In one, the imaging system is a transfer system in which a support carrying a layer of photosensitive microcapsules is image-wise exposed to radiation and assembled with a developer sheet, e.g., a sheet containing a layer of a Lewis acid such as a phenolic resin. The assembly is subjected to pressure to rupture the microcapsules and the microcapsules image-wise leak their contents to the developer sheet where the color precursor is colored. In another embodiment, the imaging system is a self-contained imaging system in which the photosensitive microcapsules and the Lewis acid are carried on the surface of a common substrate in one layer or in juxtaposed layers. In a further embodiment of the invention, as described in U.S. application Ser. No. 08/570,658 now U.S. Pat. No. 5,783,353 and published International Application WO 95/34845, a layer containing photosensitive microcapsules and a developer material is interposed between two plastic films, at least one of which is transparent. Using a combination of an adhesive and a subbing layer, the films are permanently sealed to provide a film unit. This construction is advantageous because it prevents the chemical reactants in the imaging system from coming into contact with the user.

The imaging system is preferably a full color imaging system in which three different sets of microcapsules are used in combination and each set of microcapsules is sensitive to a distinct wavelength band. This full color system is described in U.S. Pat. No. 4,842,976. In accordance with one commercial manifestation of the imaging system, three sets of microcapsules respectively containing cyan, magenta and yellow color precursors are respectively sensitive to red, green and blue light are employed. In a further embodiment, these microcapsules are sensitized using a so-called "dye-borate photoinitiator" of the type described in U.S. Pat. No. 4,772,530 to Gottschalk. These photoinitiators, in one embodiment, are complexes of cationic cyanine dyes and a boranyl anion such as a triphenylbutylboranyl anion. For making photocopies and other applications employing visible light sources, imaging systems employing red-sensitive, blue-sensitive and green-sensitive microcapsules are desirable but one of the difficulties that is encountered in designing an imaging system with red, green and blue sensitivity is cross-talk. That is, the absorption spectra of the red and/or green and/or blue photoinitiators may overlap. In this case, it is important that in exposing the microcapsule to limit the amount of light which occurs in an overlapping region. Otherwise, the color quality of the reproduction will not be good. The art discloses a number of approaches that can be taken to mitigate this problem. However, with the proliferation of digital imaging systems, there are a host of applications in which red, green and blue sensitivity is not required. In particular printers can be designed which employ radiation sources which emit at wavelengths outside the visible spectrum, for example, in the infrared region. This presents an opportunity to minimize the problems associated with cross-talk since it is no longer necessary to restrict the sensitivity range of a photosensitive material to the visible region, the sensitivity of the imaging system can be extended into the infrared region at one end of the spectrum and optionally the ultraviolet region at the other end.

SUMMARY OF THE INVENTION

In accordance with the present invention, the foregoing imaging system and, more particularly, the imaging system described in U.S. Pat. No. 4,772,530, is modified to include one or more infrared photosensitive compositions and, more particularly, to include one or more photosensitive compositions in which the photoinitiator is a complex between an infrared-sensitive dye and a boranyl anion of the type mentioned above.

Accordingly, one embodiment of the invention resides in an imaging system comprising a support having a layer of at least one set of photosensitive microcapsules on the surface thereof, said microcapsules being sensitive to distinct band of radiation and containing a complex of an infrared sensitive cationic dye and a boranyl anion as photoinitiator.

In another embodiment, the imaging system includes cyan forming, magenta forming and yellow forming capsules and at least one set of capsules includes an infrared sensitive dye borate compound as a photoinitiator. Optionally at least one other set includes a visible light sensitive dye borate compound or an ultraviolet initiator.

In still another embodiment, the imaging system comprises three sets of photohardenable microcapsules with one set being sensitive to infrared radiation, and the second and third sets being sensitive to visible and/or ultraviolet radiation.

In still another embodiment, all three sets of microcapsules contain a photohardenable composition containing a complex of a cationic infrared sensitive dye and a boranyl anion.

DETAILED DESCRIPTION OF THE INVENTION

Examples of infrared-sensitive photoinitiators which can be employed in the imaging system of the present invention are described in Japanese Published Applications 3-221506; 4-261405; 8-100011; 8-100012; and 8-34808, all of which are incorporated herein by reference for a description of the cationic dyes and methods for obtaining the photoinitiators. A table of the infrared sensitive cationic dyes described in the aforementioned patents is provided in the following Table 1 where "Ph" indicates a phenyl group "Me" indicates a methyl group, "Bu" indicates a butyl group, and "Et" indicates an ethyl group:

TABLE 1

| No. | Dye Structure | λmax (TMPTA) |
|---|---|---|
| 1 | | 820 nm |
| 2 | | 830 nm |
| 3 | | 822 nm |
| 4 | | 768 nm |
| 5 | | 748 nm |
| 6 | | 785 nm |
| 7 | | 828 nm |

TABLE 1-continued

| No. | Dye Structure | λmax (TMPTA) |
|---|---|---|
| 7A | 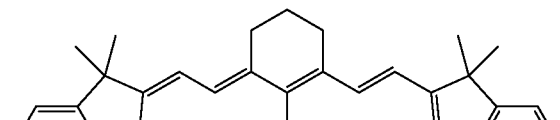 | 813 nm |
| 8 |  | 814 nm |

The infrared dyes in Table 1 are complexed with a borate anion. Any of the borate anions described in U.S. Pat. No. 4,772,530 can be used in this invention. The preferred boranyl anion is a triphenyl n-butylboranyl anion. The anions can be represented by the general formula (I):

where $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups.

For example particularly preferred anions are triphenylalkylborate and trianisylalkylborate anions such as triphenylbutylborate and trianisylbutylborate anions because they readily dissociate to triphenylborane or trianisylborane and a butyl radical. On the other hand tetrabutylborate anion does not work well presumably because the tetrabutylborate radical is not stable and it readily accepts an electron back from the dye in a back electron transfer and does not dissociate efficiently. Likewise, tetraphenylborate anion is very poor because the phenyl radical is not easily formed.

Preferably, at least one but not more than three of $R^1$, $R^2$, $R^3$, and $R^4$ is an alkyl group. Each of $R^1$, $R^2$, $R^3$, and $R^4$ is an alkyl group. Each of $R^1$, $R^2$, $R^3$, and $R^4$ can contain up to 20 carbon atoms, and they typically contain 1 to 7 carbon atoms. More preferably $R^1$–$R^4$ are a combination of alkyl group(s) and aryl group(s) or aralkyl group(s) and still more preferably a combination of three aryl groups and one alkyl group.

Representative examples of alkyl groups represented by $R^1$–$R^4$ are methyl, ethyl, propyl, butyl, pentyl, hexyl, octyl, stearyl, etc. and can be straight or branched chain and possibly cyclic. The alkyl groups may be substituted, for example, by one or more halogen, cyano, acyloxy, acyl, aryl, alkoxy or hydroxy groups.

Representative examples of aryl groups represented by $R^1$–$R^4$ include phenyl, naphthyl and substituted aryl groups such as anisyl. Alkaryl groups include methylphenyl, dimethylphenyl, etc. Representative examples of aralkyl groups represented by groups include benzyl. Representative alicyclic groups include cyclobutyl, cyclopentyl, and cyclohexyl groups. Examples of an alkynyl group are propynyl and ethynyl, and examples of alkenyl groups include a vinyl group.

Other infrared sensitive complexes useful as photoinitiators in the invention described in Japanese Application 4-261405 are shown in Table 2:

TABLE 2

| No. | Dye Cation | Borate Anion |
|---|---|---|
| 9 | Et₂N—⌬—N=⌬=O···Ni²⁺···O=⌬=N—⌬—NEt₂ | 2 Ph₃BBuⁿ<br>Ph = phenyl<br>Bu = butyl |
| 10 | Et₂N—⌬—N=⌬=O···Cu²⁺···O=⌬=N—⌬—NEt₂ | 2 Ph₃BBuⁿ |

TABLE 2-continued

| No. | Dye Cation | Borate Anion |
|---|---|---|
| 11 | Pr₂N–C₆H₄–N=...–Ni²⁺–...=N–C₆H₄–NPr₂ (bis(quinone imine quinoline) Ni complex); Pr = CH₂CH₂CH₃ | 2 Ph₃BBuⁿ |
| 12 | Pr₂N–C₆H₄–N=...–Cu²⁺–...=N–C₆H₄–NPr₂ | 2 Ph₃BBuⁿ |
| 13 | (NCC₂H₄)₂N–C₆H₄–N=...–Ni²⁺–...=N–C₆H₄–N(C₂H₄CN)₂ | 2 Ph₃BBuⁿ |
| 14 | (NCC₂H₄)₂N–C₆H₄–N=...–Cu²⁺–...=N–C₆H₄–N(C₂H₄CN)₂ | 2 Ph₃BBuⁿ |
| 15 | [(H₃CO₂CC₂H₄)₂N–C₆H₃(Cl)–N=...quinoline–O]₂Ni²⁺ | 2 Ph₃BBuⁿ |
| 16 | [(H₃CO₂CC₂H₄)₂N–C₆H₃(Cl)–N=...quinoline–O]₂Cu²⁺ | 2 Ph₃BBuⁿ |
| 17 | [(H₃CO₂CC₂H₄)₂N–C₆H₃(OCH₃)–N=...quinoline–O]₂Ni²⁺ | 2 Ph₃BBuⁿ |

TABLE 2-continued

| No. | Dye Cation | Borate Anion |
|---|---|---|
| 18 | [structure: dye cation with $(H_3CO_2CC_2H_4)_2N$– aryl–NHAc, –N=, quinoline-one, Ni$^{2+}$]$_2$; Ac = COCH$_3$ | 2 Ph$_3$BBu$^n$ |
| 19 | [structure: $H_3CO_2CC_2H_4$(CH$_3$)N–aryl–N=quinoline-one–Ni$^{2+}$]$_2$ | 2 Ph$_3$BBu$^n$ |
| 20 | [structure: $(C_2H_5)_2$N–(methyl-aryl)–N=quinoline-one–Ni$^{2+}$]$_2$ | 2 Ph$_3$BBu$^n$ |
| 21 | [structure: $(C_2H_5)_2$N–(methyl-aryl)–N=quinoline-one–Ni$^{2+}$]$_2$ | 2 Ph$_3$BBu$^n$ |
| 22 | [structure: $(C_2H_5)_2$N–aryl–N=methylquinoline-one–Ni$^{2+}$]$_2$ | 2 Ph$_3$BBu$^n$ |
| 23 | [structure: $(C_2H_5)_2$N–aryl–N=methylquinoline-one–Ni$^{2+}$]$_2$ | 2 Ph$_3$BBu$^n$ |
| 24 | [structure: $(C_2H_5)_2$N–(methyl-aryl)–N=quinoline-one–Cu$^{2+}$]$_2$ | 2 Ph$_3$BBu$^n$ |

Using an infrared sensitive dye borate in at least one set of the microcapsules enable the sensitivities of the microcapsules to be spaced apart to minimize overlap in their sensitivity curves and thereby minimize crosstalk. Infrared sensitive borates can be used in any or all of the cyan, magenta or yellow forming microcapsules. In one example, an imaging system can be designed in which the microcapsules are sensitive at 750, 850 and 1050 nm. In another embodiment, the red sensitive capsules described in U.S. Pat. No. 4,772,530 (Gottschalk) are replaced with infrared sensitive microcapsules prepared using one of the dyes in the appendix such as the dye #5 in Table 1. In another embodiment an imaging system can be designed in which the microcapsules are sensitive at 800, 900 and 1100 nm. In conventional systems, the cyan, magenta and yellow forming microcapsules are sensitive at 450, 550, 650 nm respectively. In other embodiments of the invention, any of 450, 550, and 650 sensitizers is replaced with an infrared dye. Preferably the magenta 550 initiator is replaced with an infrared dye to achieve the most separation in the absorptions. For example, a 450, 840, 650 nm system might be used.

The infrared sensitive compositions can be modified to include an autoxidizer such as N,N-dimethylaniline as described in U.S. Pat. No. 4,772,530 which is incorporated herein by reference. Likewise, microcapsules for encapsulating the photohardenable composition, cyan, magenta and yellow color precursors, developer materials, photohardenable compositions including photopolymerizable acrylate compositions are described in detail in U.S. Pat. No. 4,772,530. If it is desired to use an ultraviolet initiator in one or more sets of microcapsules, the ultraviolet initiator can be selected from among those that are known in the art. Some examples are provided in U.S. Pat. No. 4,399,209.

The infrared sensitive dye is normally used in an amount up to 1% by weight based on the weight of the photopolymerizable species and more typically in an amount of about 0.2 to 0.5% by weight. However, those skilled in the art will recognize that the amount is easily adjusted to achieve the desired sensitivity and photographic response in the photosensitive material.

Having described the invention in detail and by reference to preferred embodiments thereof, it will be apparent that modifications and variations are possible without departing from the scope of the invention defined in the appended claims.

What is claimed is:

1. A photosensitive material comprising a support having a layer of microcapsules on one surface thereof, and microcapsules having an internal phase including a photohardenable composition, said composition comprising a free radical addition polymerizable or crosslinkable compound, a photoinitiator, and a color-forming agent, said microcapsules including a first set of microcapsules containing a cyan color-forming agent, a second set of microcapsules containing a magenta color-forming agent and a third set of microcapsules containing a yellow color-forming agent, at least one of said first, second and third sets of microcapsules containing a complex of an infrared sensitive cationic dye and a boranyl anion capable of absorbing infrared radiation and producing free radicals which initiate free radical polymerization or crosslinking of said polymerizable or crosslinkable compound and wherein the other sets of microcapsules are sensitive to visible or ultraviolet radiation.

2. The photosensitive material of claim 1 wherein said boranyl anion is represented by the formula I:

where $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups.

3. The photosensitive material of claim 1 wherein said material is capable of being used in forming images by a process which comprises the steps of image-wise exposing said microcapsules to three distinct wavelengths of actinic radiation which respectively harden said first, second and third sets of microcapsules and subjecting said microcapsules to a uniform rupturing force.

4. The photosensitive material of claim 3 wherein at least one of said infrared radiation is greater than 800 nm.

5. The photosensitive material of claim 4 wherein at least one of said sets of microcapsules, other than said set containing said infrared-sensitive complex, contains a visible light sensitive complex of a cationic dye and a boranyl anion.

6. The photosensitive material of claim 4 wherein at least one of said sets of microcapsules, other than said set containing said infrared-sensitive complex, contains an ultraviolet sensitive photoinitiator.

7. The photosensitive material of claim 1 wherein the complex is a complex of a dye selected from the group consisting of:

| No. | Dye Structure | λmax (TMPTA) |
|---|---|---|
| 1 | 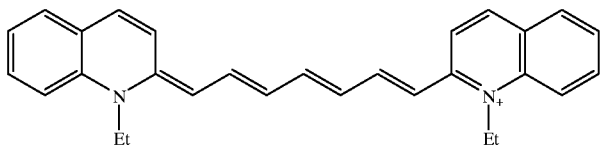 | 820 nm |

Et = C₂H₅

-continued
| No. | Dye Structure | λmax (TMPTA) |
|---|---|---|
| 2 | 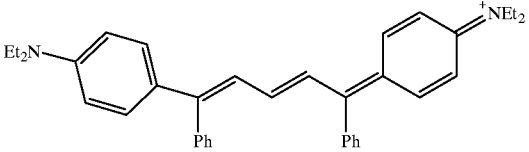 Ph = phenyl | 830 nm |
| 3 | 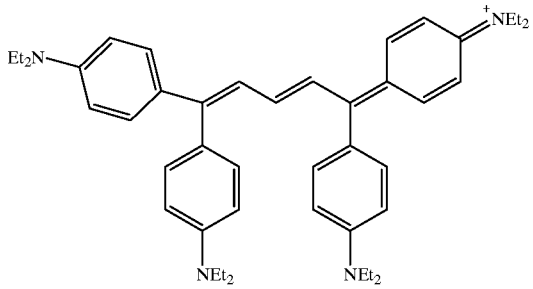 | 822 nm |
| 4 | 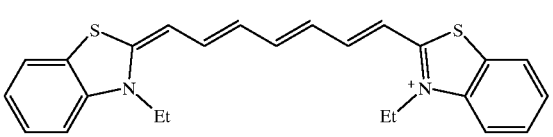 | 768 nm |
| 5 | 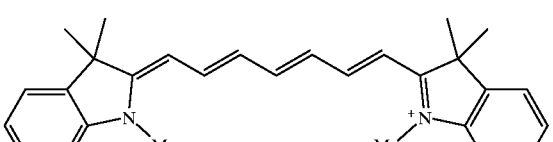 Me = CH$_3$ | 748 nm |
| 6 | 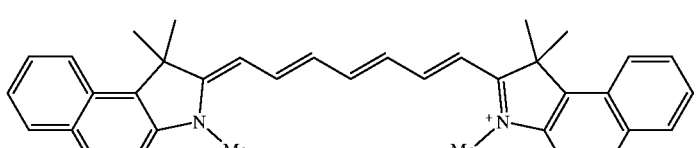 | 785 nm |
| 7 | 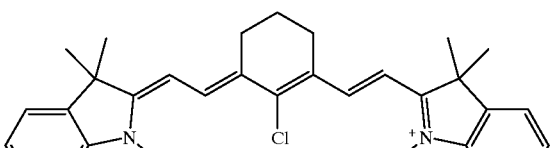 | 828 nm |
| 7A | 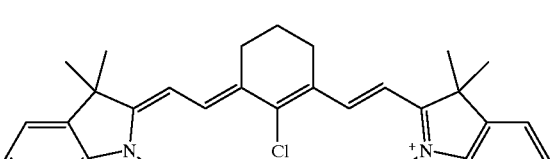 | 813 nm |

-continued

| No. | Dye Structure | λmax (TMPTA) |
|---|---|---|
| 8 | | 814 nm |
| 9 | | 2 Ph₃BBuⁿ<br>Ph = phenyl<br>Bu = butyl |
| 10 | | 2 Ph₃BBuⁿ |
| 11 | | 2 Ph₃BBuⁿ<br>Pr = CH₂CH₂CH₃ |
| 12 | | 2 Ph₃BBuⁿ |
| 13 | | 2 Ph₃BBuⁿ |
| 14 | | 2 Ph₃BBuⁿ |
| 15 | | 2 Ph₃BBuⁿ |

-continued
| No. | Dye Structure | λmax (TMPTA) |
|---|---|---|
| 16 | 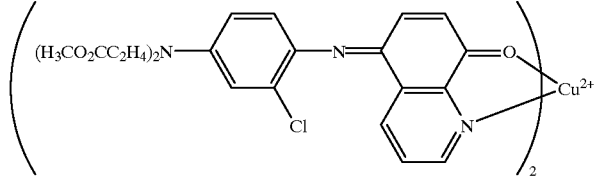 | 2 Ph₃BBuⁿ |
| 17 | 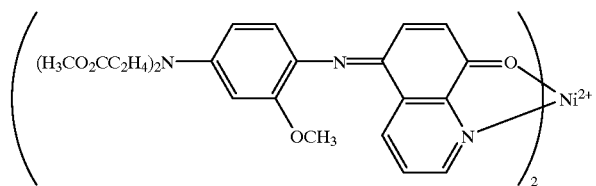 | 2 Ph₃BBuⁿ |
| 18 | 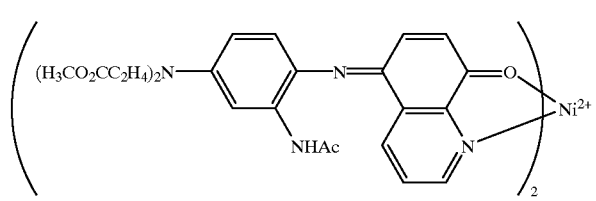 Ac = COCH₃ | 2 Ph₃BBuⁿ |
| 19 | 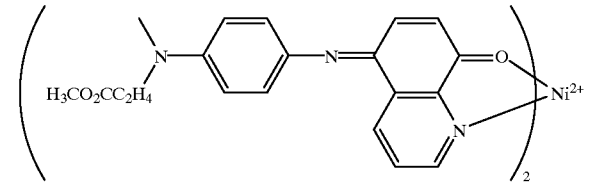 | 2 Ph₃BBuⁿ |
| 20 | 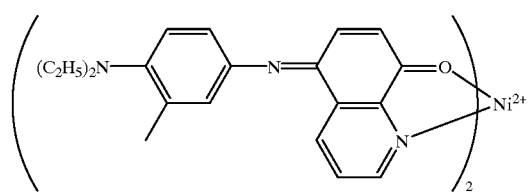 | 2 Ph₃BBuⁿ |
| 21 | 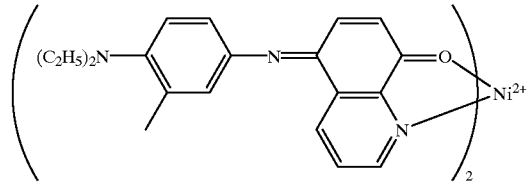 | 2 Ph₃BBuⁿ |
| 22 | 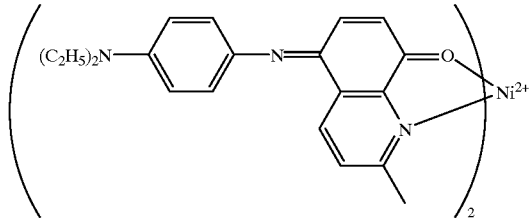 | 2 Ph₃BBuⁿ |

-continued

| No. | Dye Structure | λmax (TMPTA) |
|---|---|---|
| 23 | ((C$_2$H$_5$)$_2$N—C$_6$H$_4$—N=... Ni$^{2+}$)$_2$ | 2 Ph$_3$BBu$^n$ |
| 24 | ((C$_2$H$_5$)$_2$N—C$_6$H$_3$(CH$_3$)—N=... Cu$^{2+}$)$_2$ | 2 Ph$_3$BBu$^n$. |

8. A photosensitive material comprising a support having a layer of microcapsules on one surface thereof, and microcapsules having an internal phase including a photohardenable composition, said composition comprising a free radical addition polymerizable or crosslinkable compound, a photoinitiator, and a color-forming agent, said microcapsules including a first set of microcapsules containing a cyan color-forming agent, a second set of microcapsules containing a magenta color-forming agent and a third set of microcapsules containing a yellow color-forming agent, at least one of said first, second and third sets of microcapsules containing a complex of an infrared sensitive cationic dye and a boranyl anion capable of absorbing infrared radiation and producing free radicals which initiate free radical polymerization or crosslinking of said polymerizable or crosslinkable compound wherein one set of microcapsules is sensitive at about 800 nm, another set is sensitive at about 900 nm and a third set is sensitive at about 1100 nm.

* * * * *